United States Patent
Chang et al.

(10) Patent No.: US 11,174,156 B2
(45) Date of Patent: *Nov. 16, 2021

(54) BONDING PROCESS FOR FORMING SEMICONDUCTOR DEVICE STRUCTURE

(71) Applicant: Taiwan Semiconductor Manufacturing Co., Ltd., Hsin-Chu (TW)

(72) Inventors: Chih-Hang Chang, Taoyuan (TW); I-Shi Wang, Sanxia Township (TW); Jen-Hao Liu, Zhunan Township (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/829,196

(22) Filed: Mar. 25, 2020

(65) Prior Publication Data

US 2020/0223689 A1  Jul. 16, 2020

Related U.S. Application Data

(63) Continuation of application No. 16/123,719, filed on Sep. 6, 2018, now Pat. No. 10,626,010.

(60) Provisional application No. 62/591,955, filed on Nov. 29, 2017.

(51) Int. Cl.
*B81C 1/00* (2006.01)
*B81C 3/00* (2006.01)

(52) U.S. Cl.
CPC ...... *B81C 1/00238* (2013.01); *B81C 1/00269* (2013.01); *B81C 1/00888* (2013.01); *B81C 3/005* (2013.01); *B81C 2201/013* (2013.01); *B81C 2201/0143* (2013.01); *B81C 2201/0146* (2013.01); *B81C 2203/035* (2013.01)

(58) Field of Classification Search
CPC ........ B81C 1/00238; B81C 2201/0143; B81C 2201/013; B81C 2201/0146; B81C 2203/035

See application file for complete search history.

(56) References Cited

U.S. PATENT DOCUMENTS

2006/0082256 A1  4/2006  Bibl et al.
2009/0061598 A1  3/2009  Tsai et al.
(Continued)

OTHER PUBLICATIONS

Non-Final Office Action dated Sep. 18, 2019 for U.S. Appl. No. 16/123,719.

(Continued)

*Primary Examiner* — Karen Kusumakar
(74) *Attorney, Agent, or Firm* — Eschweiler & Potashnik, LLC

(57) ABSTRACT

A semiconductor device structure is provided. The semiconductor device structure includes a first wafer comprising a first face and a second face opposite the first face and having a plurality of predetermined die areas. A plurality of recesses are disposed in the first face of the first wafer. A first recess of the plurality of recesses extends in a direction substantially parallel to a first edge of at least one of the plurality of predetermined die areas and laterally surrounds the at least one of the plurality of predetermined die areas. A second wafer is bonded to the second face of the first wafer.

20 Claims, 21 Drawing Sheets

(56) References Cited

U.S. PATENT DOCUMENTS

2011/0062827 A1    3/2011  Ichikawa et al.
2017/0200661 A1*  7/2017  Lee ........................ H01L 22/32

OTHER PUBLICATIONS

Notice of Allowance dated Dec. 17, 2019 for U.S. Appl. No. 16/123,719.

* cited by examiner

BONDING PROCESS FOR FORMING SEMICONDUCTOR DEVICE STRUCTURE

REFERENCE TO RELATED APPLICATIONS

This Application is a Continuation of U.S. application Ser. No. 16/123,719, filed on Sep. 6, 2018, which claims the benefit of U.S. Provisional Application No. 62/591,955, filed on Nov. 29, 2017. The contents of the above-referenced Patent Applications are hereby incorporated by reference in their entirety.

BACKGROUND

The semiconductor integrated circuit (IC) industry has experienced rapid growth. Technological advances in IC materials and design have produced generations of ICs. Each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

Micro-electro mechanical system (MEMS) devices have been developed. MEMS devices include devices fabricated using semiconductor technology to form mechanical and electrical features. The MEMS devices may include a number of elements (e.g., movable elements) for achieving mechanical functionality. MEMS applications include motion sensors, pressure sensors, printer nozzles, or the like. Other MEMS applications include inertial sensors, such as accelerometers for measuring linear acceleration and gyroscopes for measuring angular velocity. Moreover, MEMS applications may extend to optical applications, such as movable mirrors, and radio frequency (RF) applications, such as RF switches or the like.

However, these advances have increased the complexity of processing and manufacturing ICs. For example, a bonding process during the formation of the MEMS devices becomes more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
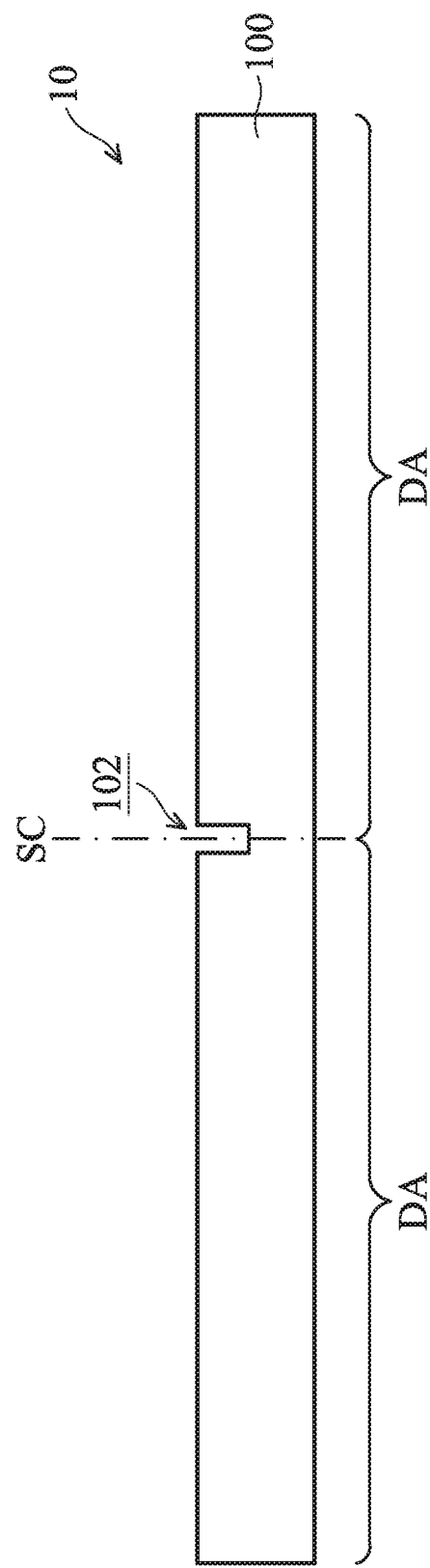
FIGS. 1A-1F are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure provide methods for forming a semiconductor device structure. The semiconductor device structure may be a package structure. In some embodiments, the package structure includes micro-electro mechanical system (MEMS) devices and/or nano-electro mechanical system (NEMS) devices packaged therein. In some embodiments, the formation of the semiconductor device structure involves stacking two or more wafers. The wafers may be stacked through a bonding process. In some embodiments, the bonding process includes a eutectic bonding process.

FIGS. 1A-1F are cross-sectional views of various stages of a process for forming a semiconductor device structure, in accordance with some embodiments. As shown in FIG. 1A, a wafer 10 is received or formed. The wafer 10 includes a base 100. The base 100 is used to support or carry subsequently formed elements. In some embodiments, the base 100 is made of or includes a semiconductor material, a dielectric material, one or more other suitable materials, or a combination thereof. In some embodiments, the wafer 10 is a semiconductor wafer, such as a silicon wafer. In some other embodiments, the wafer 10 is a dielectric wafer, such as a glass wafer. In some embodiments, there is no transistor formed and/or provided in the wafer 10.

Figure 2:
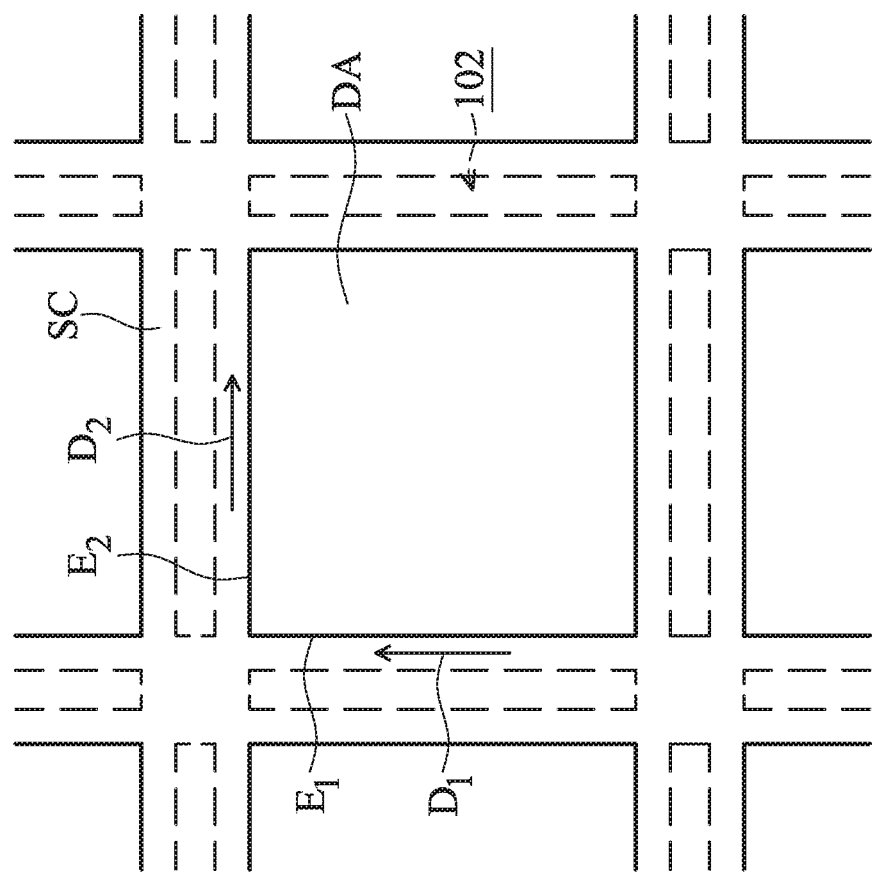
FIG. 2 is a top view of an intermediate stage of a process for forming a semiconductor device structure, in accordance with some embodiments.

FIG. 2 is a top view of an intermediate stage of a process for forming a semiconductor device structure, in accordance with some embodiments. In some embodiments, FIG. 2 shows the top view of a portion of the wafer 10 shown in FIG. 1A. In some embodiments, the wafer 10 has multiple predetermined die areas DA, as shown in FIGS. 1A and 2. The predetermined die areas DA are spaced apart from each other by multiple predetermined scribe lines SC. In some embodiments, the wafer 10 will be diced along the predetermined scribe lines SC to separate these die areas into multiple semiconductor dies (or semiconductor chips).

Afterwards, a recess 102 is formed on one surface of the base 100 of the wafer 10, as shown in FIG. 1A in accordance with some embodiments. In some embodiments, the recess 102 does not completely penetrate through the base 100. In some embodiments, one or more photolithography processes and one or more etching processes are used to form the recess 102. In some embodiments, the recess 102 is formed by etching the wafer 10 from a surface of the base 100.

However, embodiments of the disclosure have many variations and/or modifications. In some other embodiments, the recess 102 is formed using an energy beam, such as an ion beam, an electron beam, a laser beam, a plasma beam, or a combination thereof. In some other embodiments, the recess 102 is formed using a mechanical drilling process, an etching process, an energy beam drilling process, one or more other applicable processes, or a combination thereof.

In some embodiments, FIG. 2 shows the position and/or distribution of the recess 102. In some embodiments, the recess 102 extends in a direction $D_1$ that is substantially parallel to an edge $E_1$ of one of the predetermined die areas DA. In some embodiments, multiple recesses 102 are formed. In some embodiments, one of the recesses 102 extends in a direction $D_2$ that is substantially parallel to an edge $E_2$ of one of the predetermined die areas DA. In some embodiments, these recesses 102 are separated from each other without connecting each other. In some embodiments, the recess 102 extending along the direction $D_1$ and the recess 102 extending along the direction $D_2$ are formed in the same etching process. These recesses 102 may be formed simultaneously.

Figure 1B:
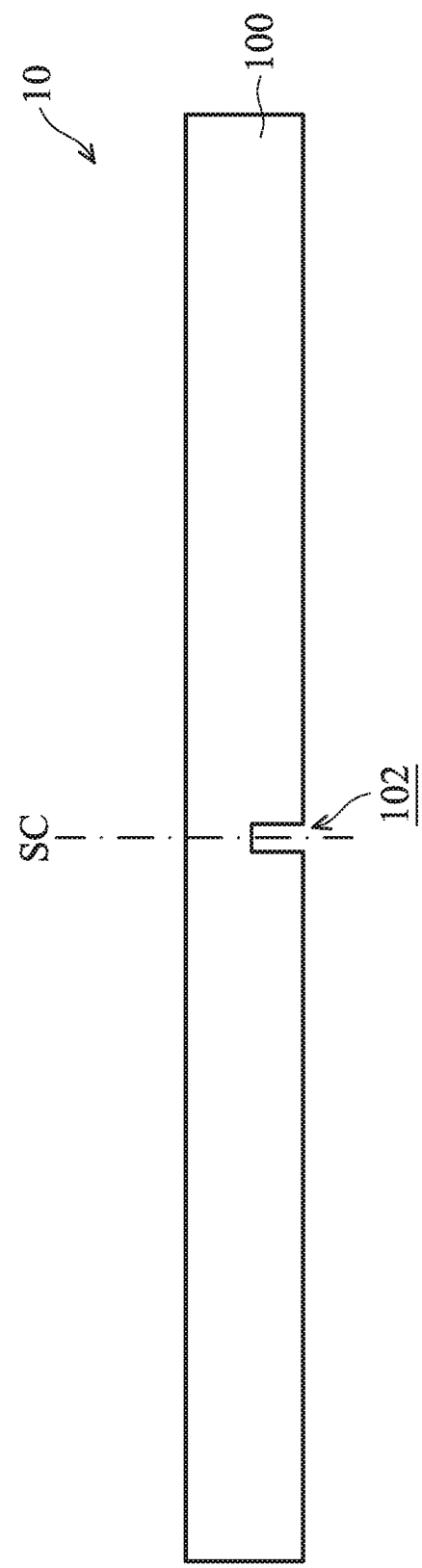

Afterwards, the structure shown in FIG. 1A is flipped upside down, as shown in FIG. 1B in accordance with some embodiments.

Figure 1C:
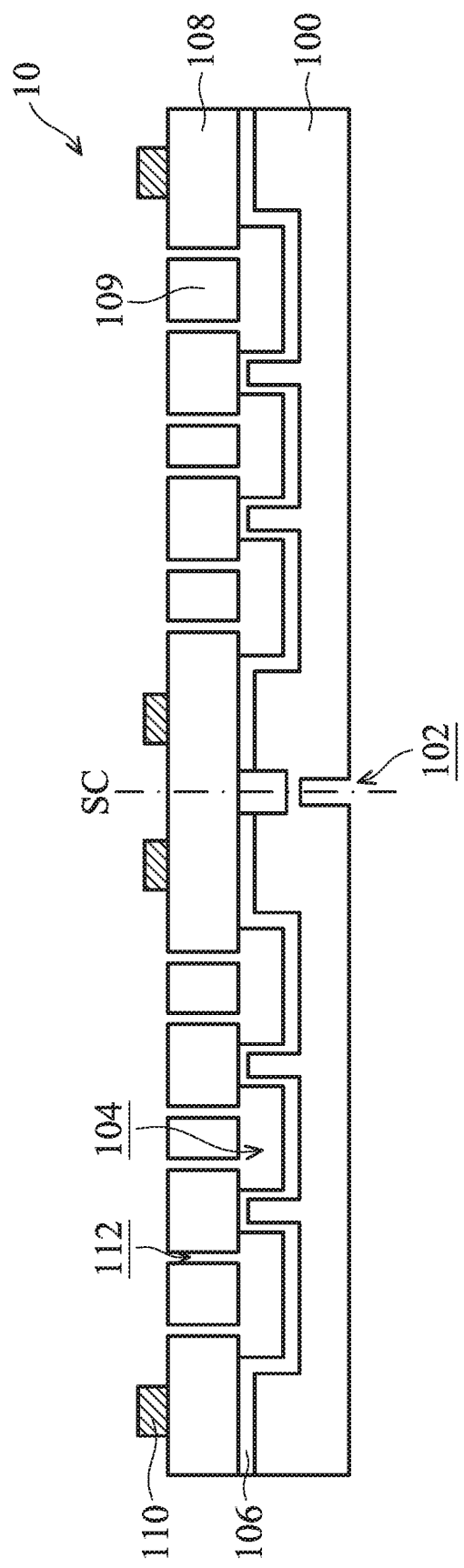

In some embodiments, multiple openings 104 are formed in the base 100. Afterwards, a material layer 106 is formed over the base 100, as shown in FIG. 1C in accordance with some embodiments. The material layer 106 may extends on sidewalls and bottoms of the openings 104. In some embodiments, the material layer 106 is used as an etch stop layer. The material layer 106 may be made of or include silicon nitride, silicon carbide, silicon oxynitride, one or more other suitable materials, or a combination thereof.

In some embodiments, a sacrificial material (not shown) is formed to fill the openings 104. The sacrificial material may be made of silicon oxide or another suitable material. Afterwards, a semiconductor layer 108 is formed over the material layer 106 and the sacrificial material. As shown in FIG. 1C, the semiconductor layer 108 is formed on a surface opposite to the recess 102 of the base 100, in accordance with some embodiments. The semiconductor layer 108 may be made of or include polysilicon, single crystalline silicon, one or more other suitable materials, or a combination thereof.

Afterwards, bonding structures 110 are formed over the semiconductor layer 108, as shown in FIG. 1C in accordance with some embodiments. In some embodiments, the bonding structures 110 are made of or include a semiconductor material, a metal material, or a combination thereof. For example, the bonding structures 110 are made of or include germanium.

Afterwards, multiple openings 112 are formed in the semiconductor layer 108, as shown in FIG. 1C in accordance with some embodiments. One or more photolithography processes and one or more etching processes may be used to pattern the semiconductor layer 108. As a result, the openings 112 are formed. The openings 112 may penetrate through the semiconductor layer 108 to expose the sacrificial material thereunder. The openings 112 may be used to define the movable elements to be formed.

Afterwards, one or more etching processes are used to completely or partially remove the sacrificial material, as shown in FIG. 1C in accordance with some embodiments. After the etching processes, some parts of the semiconductor layer 108 originally ed by the sacrificial material are now partially suspended. The sacrificial material thereunder is removed such that these parts of the semiconductor layer 108 become movable. As a result, movable elements 109 are formed. The movable elements 109 function as important features in MEMS devices and/or NEMS devices.

However, embodiments of the disclosure are not limited thereto. Many variations and/or modifications can be made to embodiments of the disclosure. In some other embodiments, the MEMS devices and/or NEMS devices are formed using different process flows. In still other embodiments, the wafer 10 does not include MEMS devices.

Figure 1D:
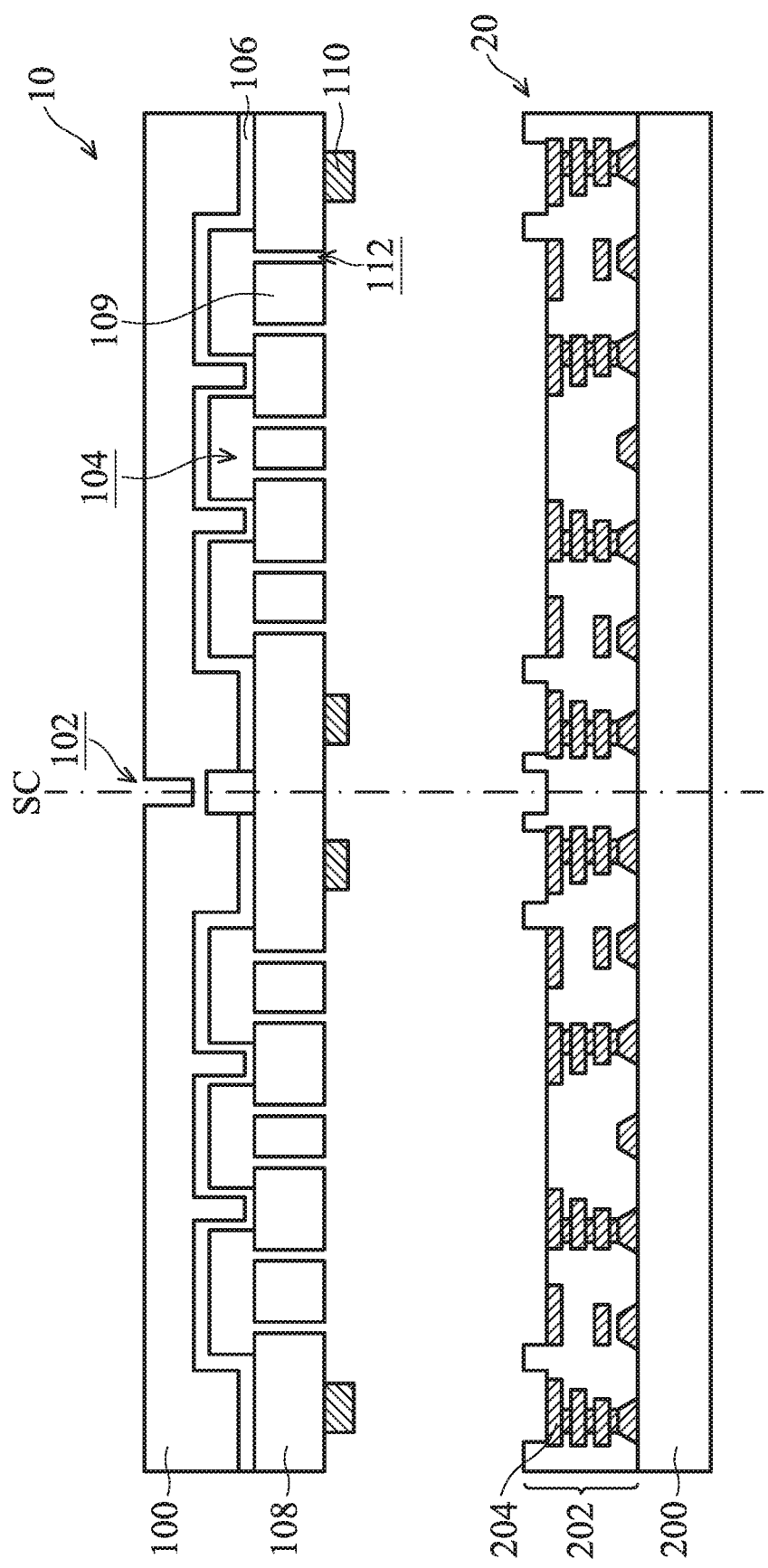

As shown in FIG. 1D, a wafer 20 is received or formed, in accordance with some embodiments. In some embodiments, the wafer 20 is a semiconductor wafer with multiple transistors formed therein. The wafer 20 may include multiple CMOS devices and be called a CMOS wafer. In some embodiments, the wafer 20 includes a semiconductor substrate 200 and an interconnection structure 202 formed over the semiconductor substrate 200.

In some embodiments, the semiconductor substrate 200 is a bulk semiconductor substrate. For example, the semiconductor substrate 200 includes silicon or other elementary semiconductor materials such as germanium. In some other embodiments, the semiconductor substrate 200 includes a compound semiconductor. The compound semiconductor may include silicon carbide, gallium arsenide, indium arsenide, indium phosphide, another suitable compound semiconductor, or a combination thereof. In some embodiments, the semiconductor substrate 200 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, isolation features (not shown) are formed in the semiconductor substrate 200 to define and isolate various device elements (not shown) formed in the semiconductor substrate 200. The isolation features include, for example, trench isolation (STI) features or local oxidation of silicon (LOCOS) features.

In some embodiments, various device elements are formed in and/or on the semiconductor substrate 200. Examples of the various device elements that may be formed in the semiconductor substrate 200 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, one or more other applicable processes, or a combination thereof.

In some embodiments, the interconnection structure 202 includes multiple dielectric layers and multiple conductive features. The dielectric layers may be made of or include carbon-containing silicon oxide, silicon oxide, borosilicate glass (BSG), phosphoric silicate glass (PSG), borophosphosilicate glass (BPSG), fluorinated silicate glass (FSG), porous dielectric material, another suitable low-k dielectric material, one or more other suitable materials, or a combination thereof.

In some embodiments, the conductive features may include conductive contacts, conductive lines, and/or conductive vias. The conductive features may be made of or include copper, aluminum, tungsten, titanium, cobalt, gold, platinum, one or more other suitable materials, or a combination thereof. The formation of the dielectric layers and the conductive features may involve multiple deposition processes, patterning processes, and planarization processes. The device elements in and/or on the semiconductor substrate 200 will be interconnected through some of the conductive features in the interconnection structure 202.

As shown in FIG. 1D, bonding structures 204 are formed on or at the surface of the wafer 20, in accordance with some embodiments. The bonding structures 204 are used to be bonded with the bonding structures 110 on the wafer 10. Therefore, the wafers 10 and 20 may be bonded together through the bonding structures 110 and 204. In some embodiments, the bonding structures 204 are made of or include a metal material, a semiconductor material, one or more other suitable materials, or a combination thereof. For example, the bonding structures 204 are made of or include aluminum. In some embodiments, the bonding structures 204 are made of Al—Cu alloy.

As shown in FIG. 1D, the structure shown in FIG. 1C is flipped upside down and ready to be bonded with the wafer 20, in accordance with some embodiments. An alignment operation is performed before the bonding of the wafers 10 and 20. As a result, each of the bonding structures 110 of the wafer 10 is substantially aligned with a corresponding one of the bonding structures 204 of the wafer 20.

Figure 1E:
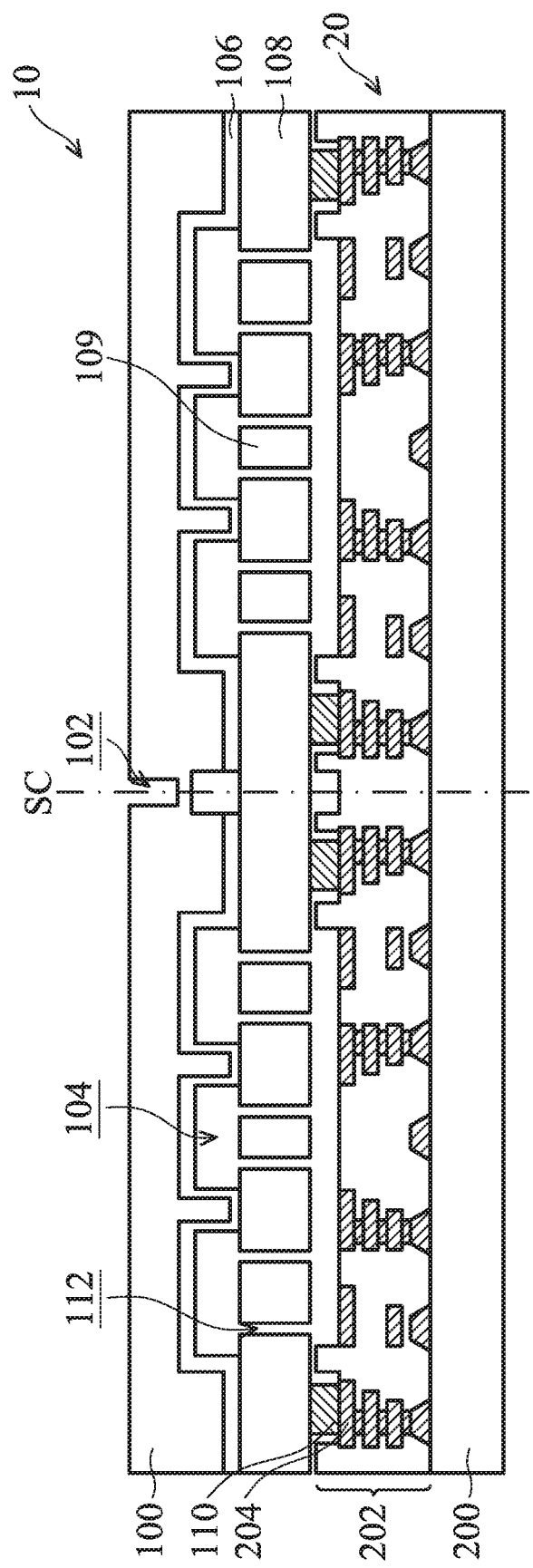

As shown in FIG. 1E, the wafers 10 and 20 are bonded together through the bonding structures 110 and 204, in accordance with some embodiments. In some embodiments, a eutectic bonding process is used to bond the wafers 10 and 20. The wafers 10 and 20 are pressed against each other at an elevated temperature. The wafers 10 and 20 are heated during the bonding process. In some embodiments, the temperature is raised to be in a range from about 350 degrees C. to about 450 degrees C. As a result, a eutectic bonding between the aligned bonding structures 110 and 204 may occur, enabling the bonding between the wafers 10 and 20.

As mentioned above, a high temperature is applied during the bonding of the wafers 10 and 20. However, since each of the wafers 10 and 20 includes different materials and elements, the thermal expansions of the wafers 10 and 20 are different from each other. Even in the same wafer, the shift caused by thermal expansion at one specific region is different from that at another specific region. For example, the shift caused by thermal expansion near the edge of the wafer is greater than that near the center of the wafer. The difference in thermal expansion may result in an insufficient alignment between the bonding structures 110 and 204. The recess 102 may be used to reduce or prevent the misalignment between the bonding structures 110 and 204 during the bonding process.

In some cases where the recess 102 is not formed, the bonding structures 110 and 204 that are originally aligned with each other may not be aligned with each other in a sufficient degree due to different thermal expansions between the wafers 10 and 20. If the bonding structures 110 and 204 are not well-aligned with each other, the interconnection between the MEMS devices (or NMES devices) and the semiconductor devices in the wafer 20 may be negatively affected or damaged.

In some embodiments, because the recess 102 is formed, the misalignment between the bonding structures 110 and 204 are prevented or significantly reduced. The recess 102 may function as an expansion joint or a buffer recess that isolates thermal expansion in local areas of the wafer 10. For example, the thermal expansion of the center portion of the wafer 10 is isolated from the thermal expansion of the edge portion of the wafer 10. The shift due to the thermal expansion near the center portion does not accumulate to the shift near the edge portion.

In some cases where the recess 102 is not formed, a shift near the center of the wafer 10 is determined to be about 1 μm. A shift near the edge of the wafer 10 is determined to be about 5 μm. In some embodiments where the recess 102 is formed, a shift near the center of the wafer 10 is determined to be about 6 μm. A shift near the edge of the wafer 10 is determined to be about 6 μm which is substantially the same as that near the center of the wafer 10. Due to the recess 102, the thermal expansions at different areas of the wafer 10 are substantially the same. Therefore, the alignment between the bonding structures 110 and 204 become easier to achieve. The performance and reliability of the semiconductor device structure are significantly improved.

Figure 1F:
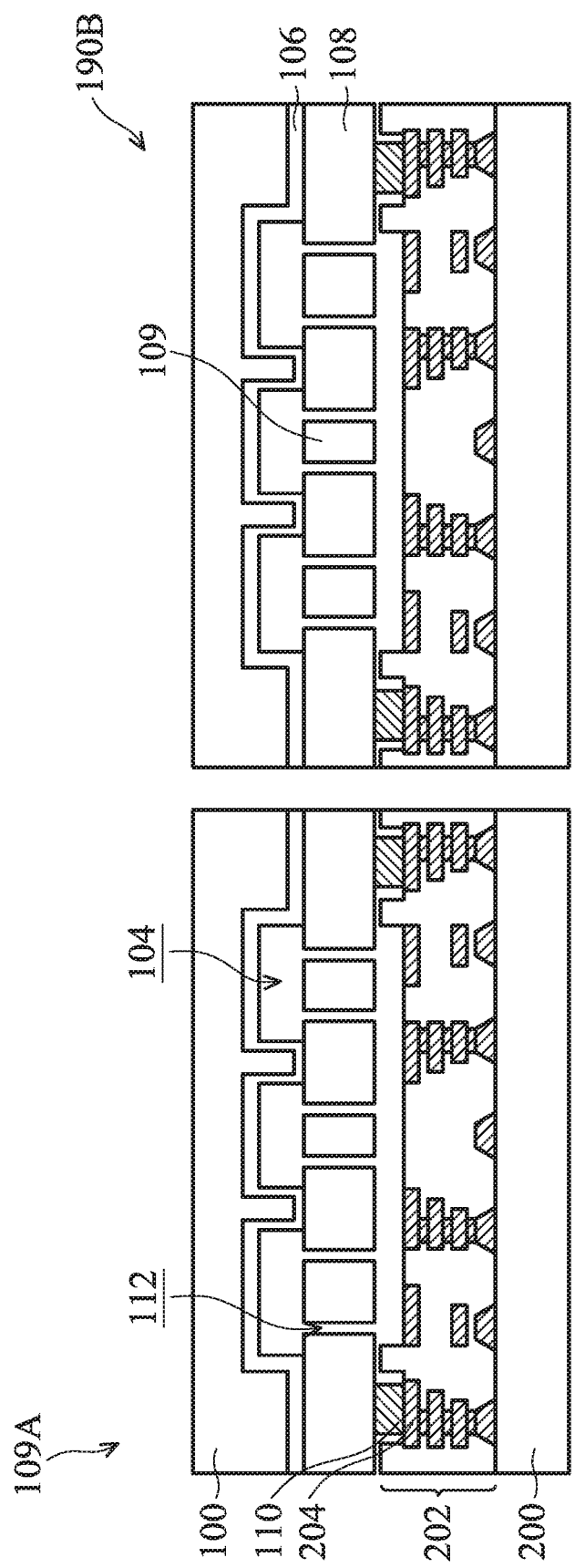

Afterwards, the bonded wafers 10 and 20 are diced along the predetermined scribe lines SC, as shown in FIG. 1F in accordance with some embodiments. As a result, multiple semiconductor device structures (such as semiconductor device structures 190A and 190B) are formed.

Many variations and/or modifications can be made to embodiments of the disclosure. The recess 102 may be designed in various ways.

Figure 3:
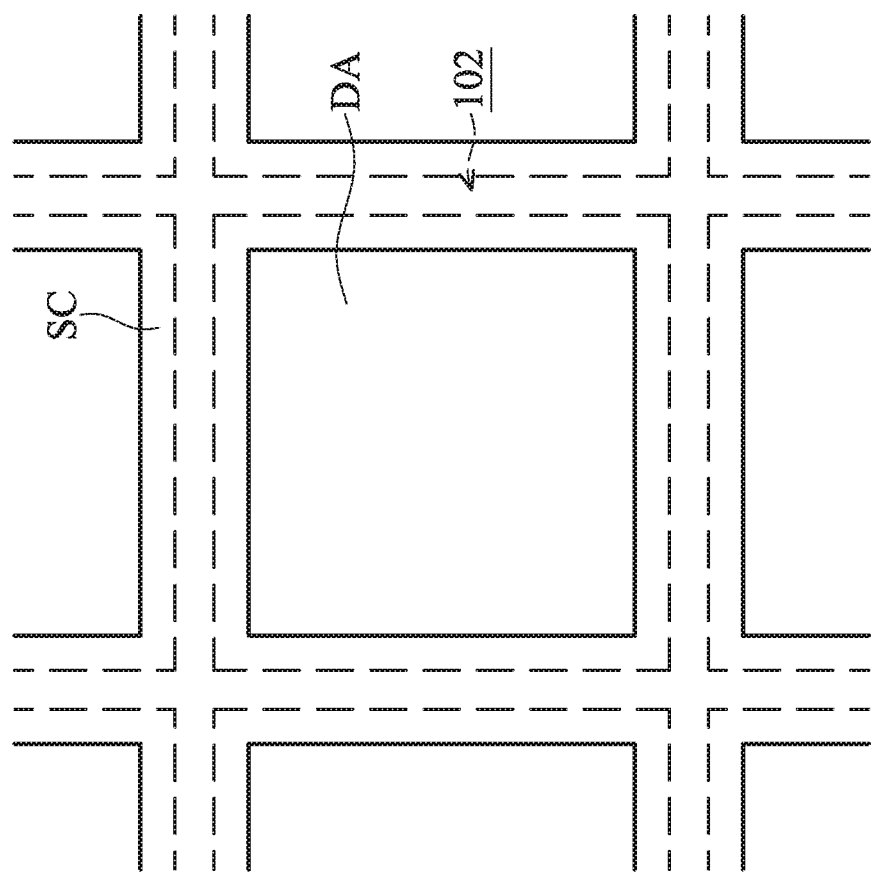
FIG. 3 is a top view of an intermediate stage of a process for forming a semiconductor device structure, in accordance with some embodiments.

FIG. 3 is a top view of an intermediate stage of a process for forming a semiconductor device structure, in accordance with some embodiments. In some embodiments, FIG. 3 shows a top view of the structure shown in FIG. 1A. In some embodiments, the recess 102 extends along one of the predetermined scribe lines SC. In some embodiments, the recess 102 is formed in one or more of the predetermined scribe lines SC. In some embodiments, the recess 102 continuously surrounds one or more of the predetermined die areas DA. In some embodiments, the recess 102 is formed along the edges of each of the die areas DA. The thermal expansion is isolated in a die-by-die manner.

Figure 4:
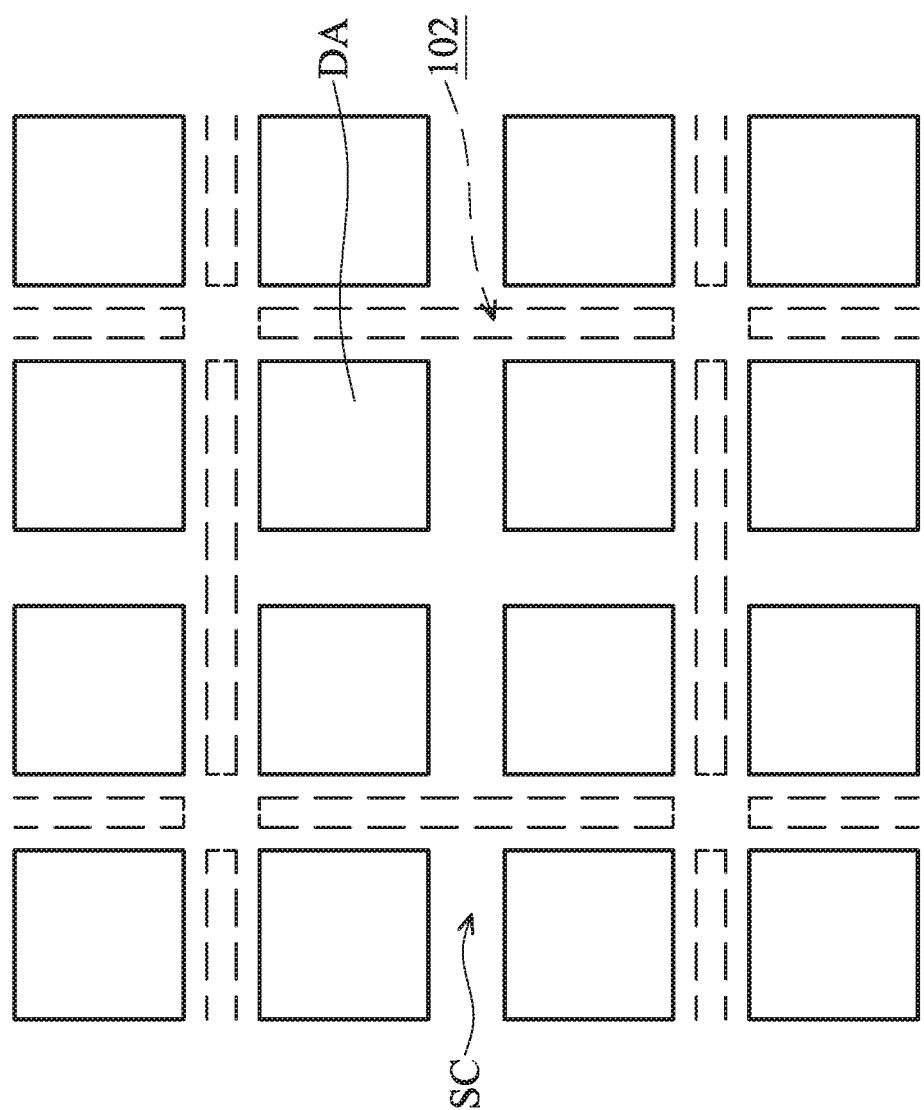
FIG. 4 is a top view of an intermediate stage of a process for forming a semiconductor device structure, in accordance with some embodiments.

Many variations and/or modifications can be made to embodiments of the disclosure. FIG. 4 is a top view of an intermediate stage of a process for forming a semiconductor device structure, in accordance with some embodiments. In some embodiments, FIG. 4 shows a top view of the structure shown in FIG. 1A. In some embodiments, multiple recesses 102 are formed. In some embodiments, one of the recesses 102 extends across one of the predetermined scribe lines SC between two of the predetermined die areas DA. In some embodiments, one (or more) of the recesses 102 is longer than two times of the edge of the die area DA, as shown in FIG. 4.

Figure 5:
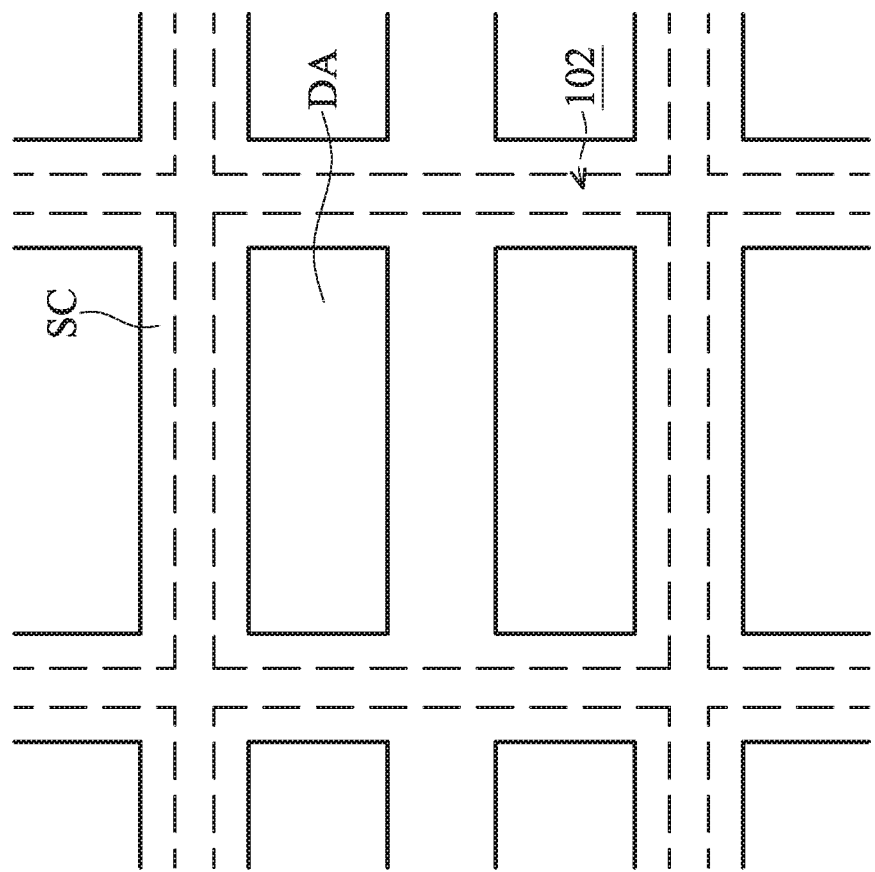
FIG. 5 is a top view of an intermediate stage of a process for forming a semiconductor device structure, in accordance with some embodiments.

Many variations and/or modifications can be made to embodiments of the disclosure. FIG. 5 is a top view of an intermediate stage of a process for forming a semiconductor device structure, in accordance with some embodiments. In some embodiments, FIG. 5 shows a top view of the structure shown in FIG. 1A. In some embodiments, the recess 102 continuously surrounds two or more of the predetermined die areas DA. As shown in FIG. 5, there are at least four die areas DA surrounded by the recess 102. The thermal expansion of the four die areas DA may be isolated from other elements positioned at other areas of the wafer 10.

Figure 6:
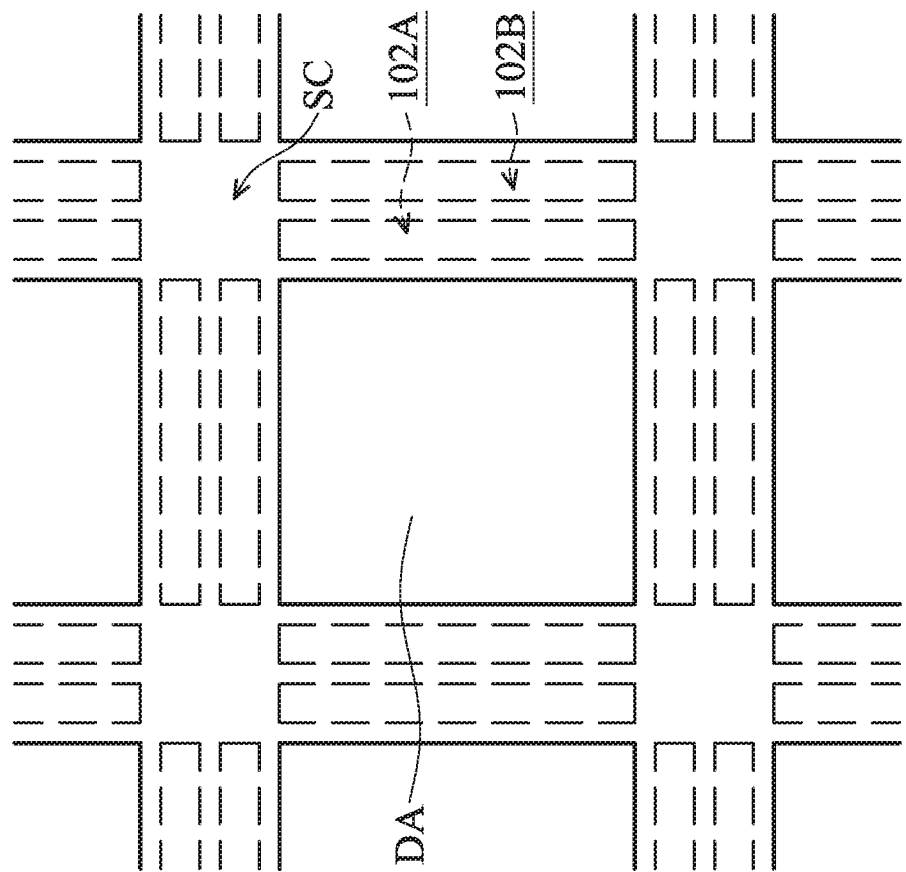
FIG. 6 is a top view of an intermediate stage of a process for forming a semiconductor device structure, in accordance with some embodiments.

Many variations and/or modifications can be made to embodiments of the disclosure. FIG. 6 is a top view of an intermediate stage of a process for forming a semiconductor device structure, in accordance with some embodiments. In some embodiments, FIG. 6 shows a top view of the structure shown in FIG. 1A. In some embodiments, recesses 102A and recesses 102B are formed. In some embodiments, each or some of the recesses 102A is adjacent to a corresponding one of the recesses 102B. In some embodiments, one of the recesses 102A and one of the recesses 102B are formed in the same predetermined scribe line SC. In some embodiments, the local thermal expansion may be isolated in a better way. In some embodiments, the recesses 102A and 102B are formed simultaneously. The recesses 102A and 102B may be formed in the same etching process.

Figure 7:
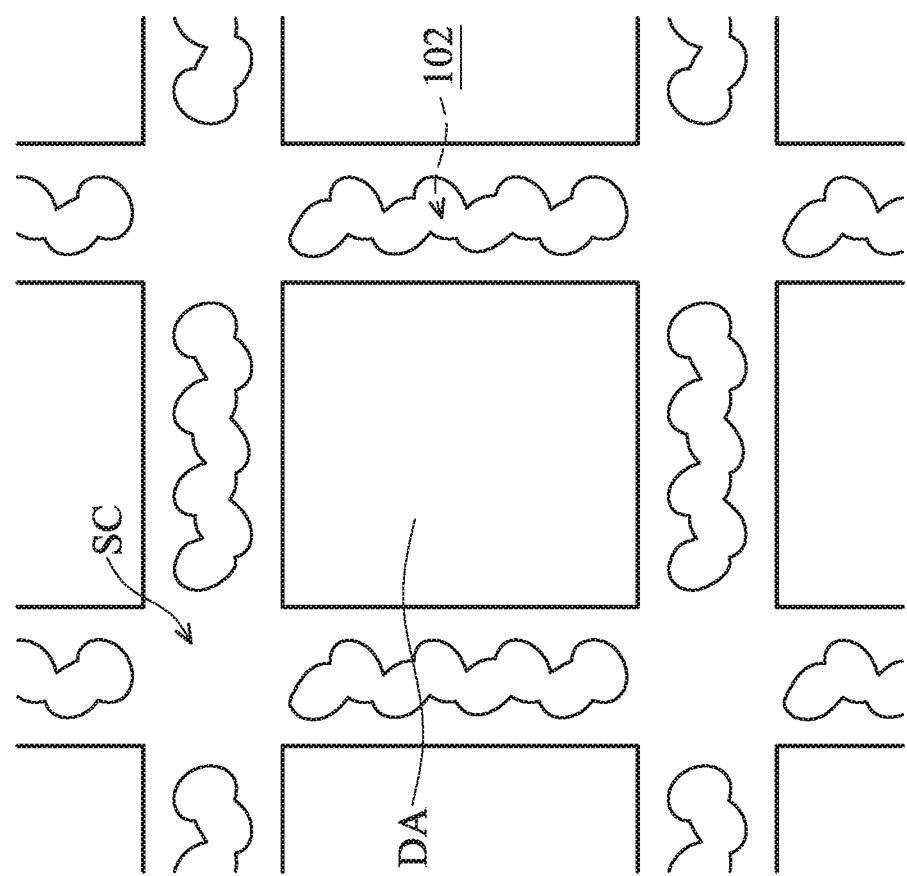
FIG. 7 is a top view of an intermediate stage of a process for forming a semiconductor device structure, in accordance with some embodiments.

Many variations and/or modifications can be made to embodiments of the disclosure. FIG. 7 is a top view of an intermediate stage of a process for forming a semiconductor device structure, in accordance with some embodiments. In some embodiments, FIG. 7 shows a top view of the structure shown in FIG. 1A. In some embodiments, the top view of the recess 102 may have various shapes. For example, the top view of the recess 102 may have a rectangular shape, a circle shape, an oval shape, or another suitable shape such as that shown in FIG. 7.

In some embodiments, the buffer recess used to isolate localized thermal expansion between different areas is formed at the wafer 10. However, many variations and/or modifications can be made to embodiments of the disclosure. In some other embodiments, the buffer recess is formed at the wafer 20.

Figure 8:
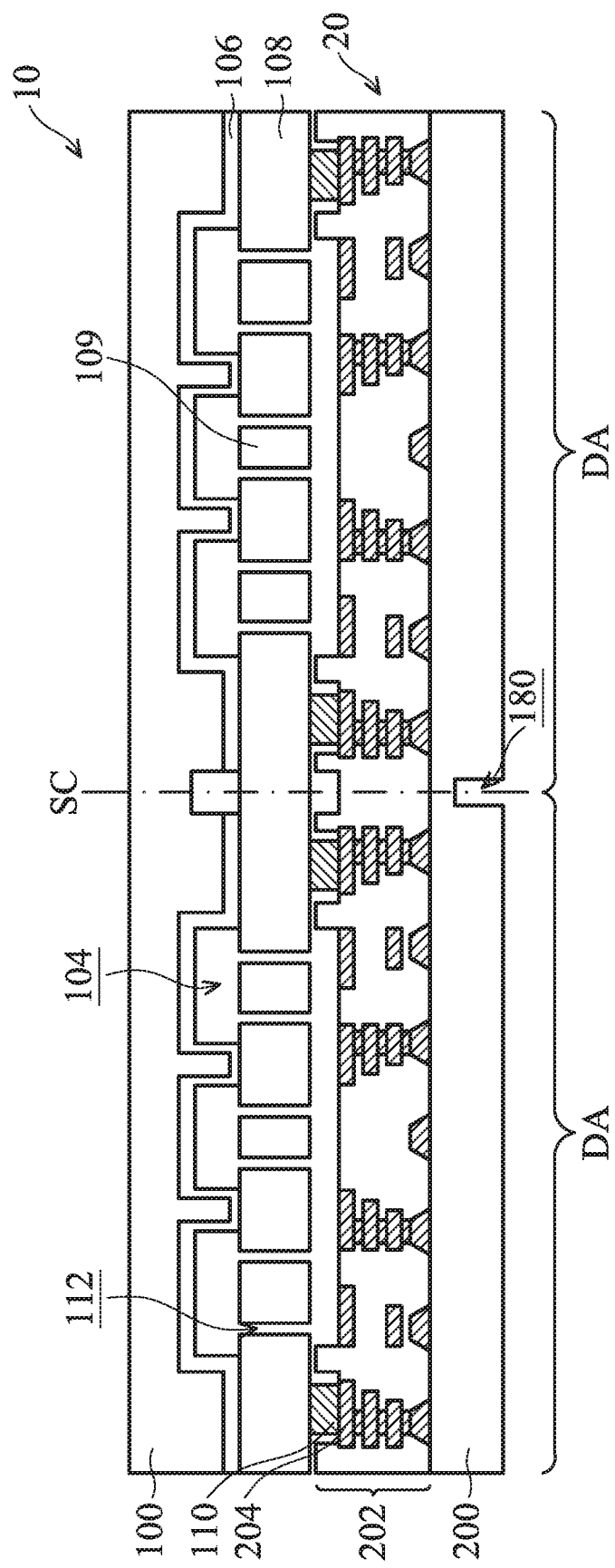
FIG. 8 is a cross-sectional view of an intermediate stage of a process for forming a semiconductor device structure, in accordance with some embodiments.

FIG. 8 is a cross-sectional view of an intermediate stage of a process for forming a semiconductor device structure, in accordance with some embodiments. In some embodiments, a recess 180 is formed in the semiconductor substrate 200 of the wafer 20. In some embodiments, the recess 180 is formed before the wafers 10 and 20 are bonded. The recess 180 may also be used as a buffer recess. The top view of the recess 180 may have many variations. For example, the recess 180 may have a top view the same as or similar to that shown in FIG. 2, 3, 4, 5, 6, or 7.

Figure 9:
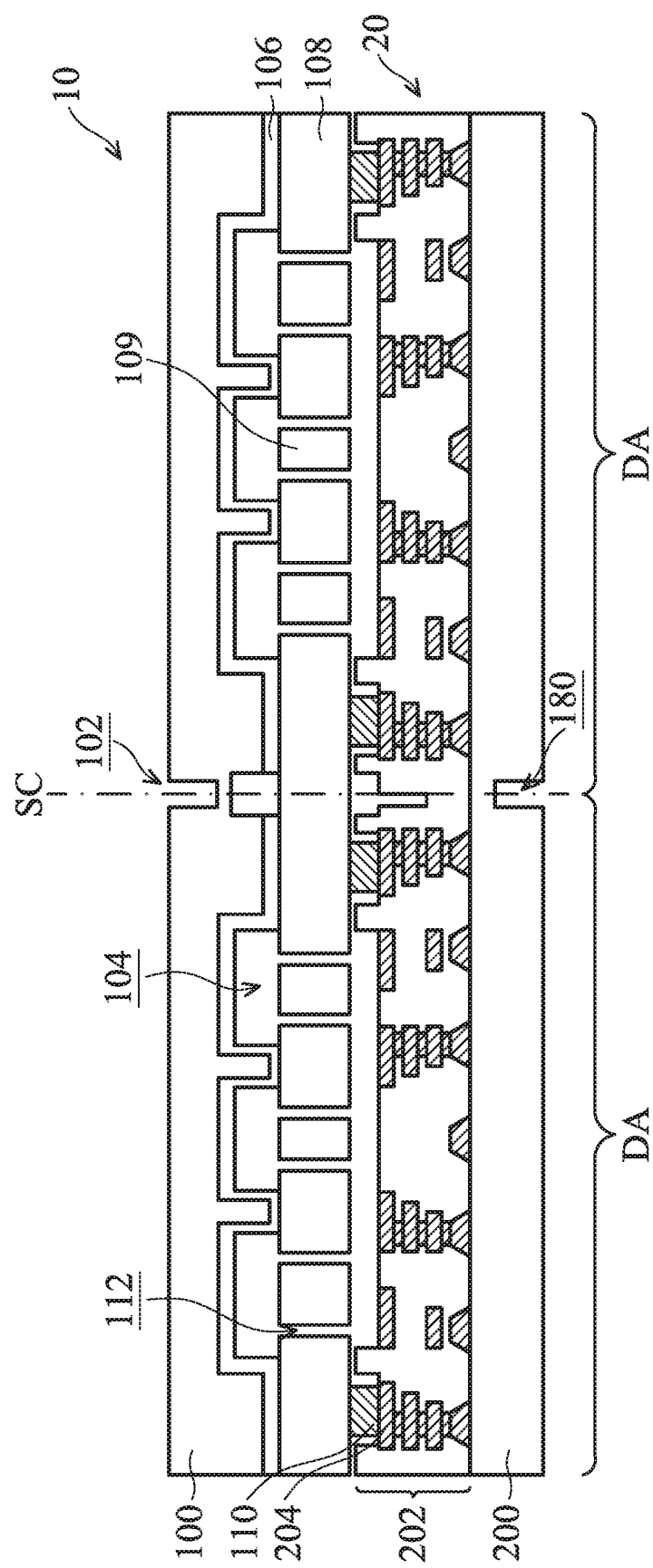
FIG. 9 is a cross-sectional view of an intermediate stage of a process for forming a semiconductor device structure, in accordance with some embodiments.

Many variations and/or modifications can be made to embodiments of the disclosure. FIG. 9 is a cross-sectional view of an intermediate stage of a process for forming a semiconductor device structure, in accordance with some embodiments. In some embodiments, the recesses 102 and 180 are formed in the wafers 10 and 20, respectively.

In some embodiments, the buffer recesses are formed in the predetermined scribe lines SC. However, embodiments of the disclosure are not limited thereto. In some embodiments, some of the buffer recesses are formed in some of the die areas.

Figure 10A:
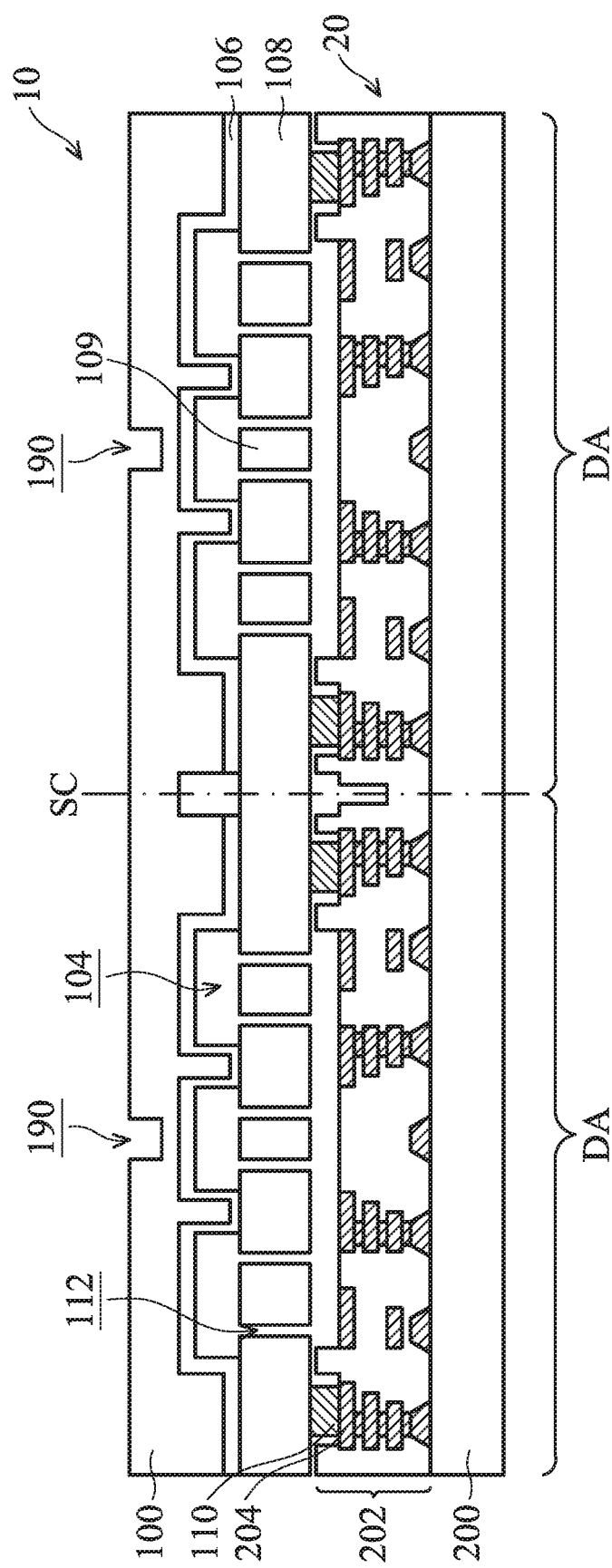
FIGS. 10A-10B are cross-sectional views of various stages of a process for forming a semiconductor device structure, in accordance with some embodiments.
Figure 10B:
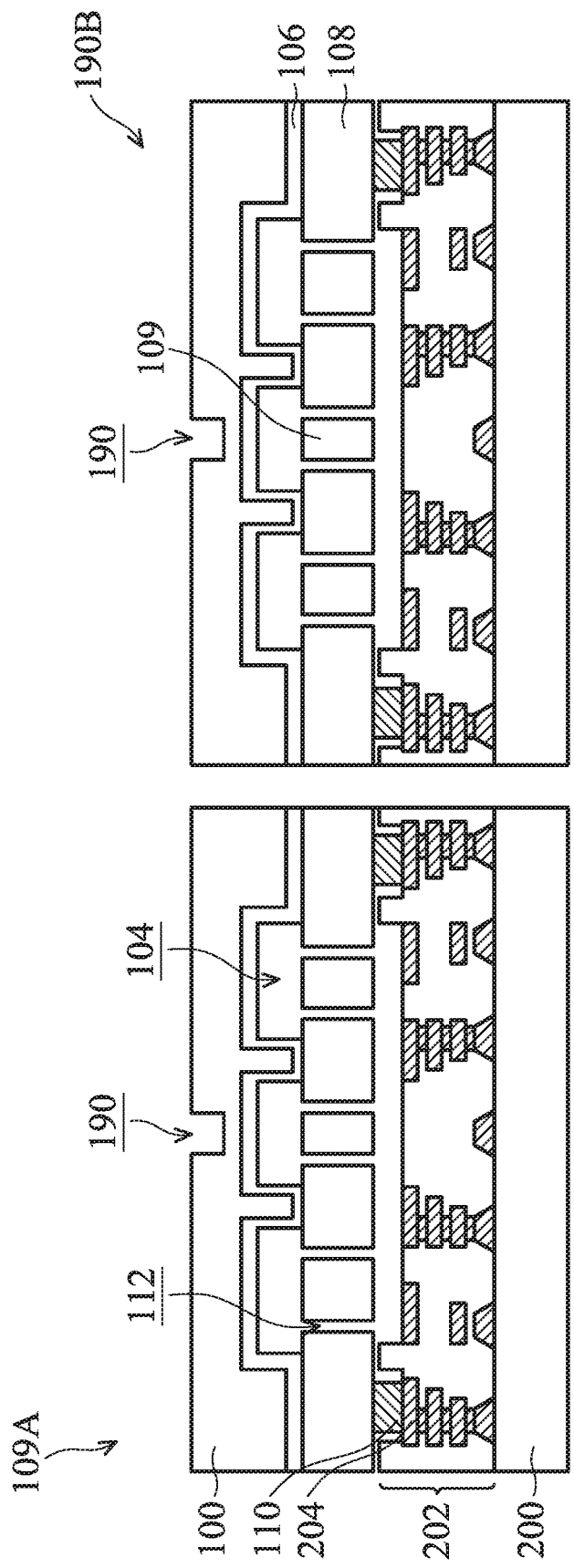

FIGS. 10A-10B are cross-sectional views of various stages of a process for forming a semiconductor device structure, in accordance with some embodiments. As shown in FIG. 10A, recesses 190 are formed in the die areas DA. The recesses 190 may be used as buffer recesses to isolate the local thermal expansion.

Afterwards, the bonded wafers 10 and 20 are diced along the predetermined scribe lines SC, in accordance with some embodiments. As a result, semiconductor device structures 190A and 190B are formed, as shown in FIG. 10B in accordance with some embodiments. In some embodiments, the recesses 190 still remain in the semiconductor device structures 190A and 190B, as shown in FIG. 10B.

In some other embodiments, not only the recesses 190 but also the recesses 102 and/or 180 are formed.

Figure 11:
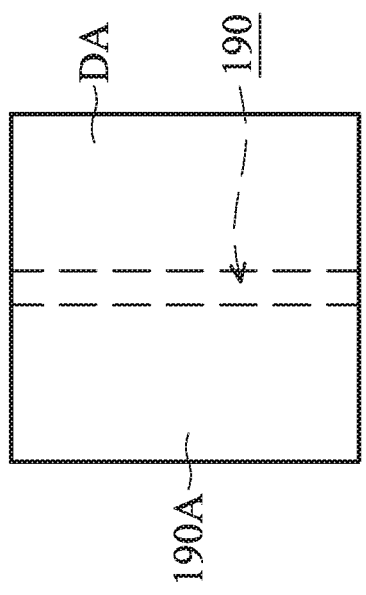
FIG. 11 is a top view of an intermediate stage of a process for forming a semiconductor device structure, in accordance with some embodiments.

FIG. 11 is a top view of an intermediate stage of a process for forming a semiconductor device structure, in accordance with some embodiments. In some embodiments, FIG. 11 shows a top view of the structure shown in FIG. 10A or 10B. In some embodiments, the recess 190 extends in a direction that is substantially parallel to an edge of the predetermined die area DA. In some embodiments, the recess 190 extends across one of the predetermined die areas DA.

Figure 12:
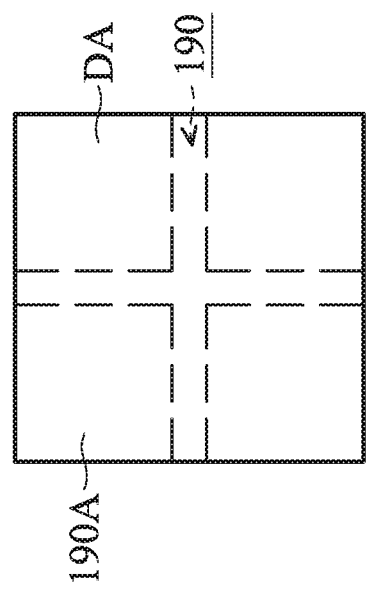
FIG. 12 is a top view of an intermediate stage of a process for forming a semiconductor device structure, in accordance with some embodiments.

Many variations and/or modifications can be made to embodiments of the disclosure. FIG. 12 is a top view of an intermediate stage of a process for forming a semiconductor device structure, in accordance with some embodiments. In some embodiments, FIG. 12 shows a top view of the structure shown in FIG. 10A or 10B. In some embodiments, the recess 190 includes multiple sections that intersect each other. In some embodiments, the sections of the recess 190 intersect at the center of the predetermined die area DA.

Figure 13:
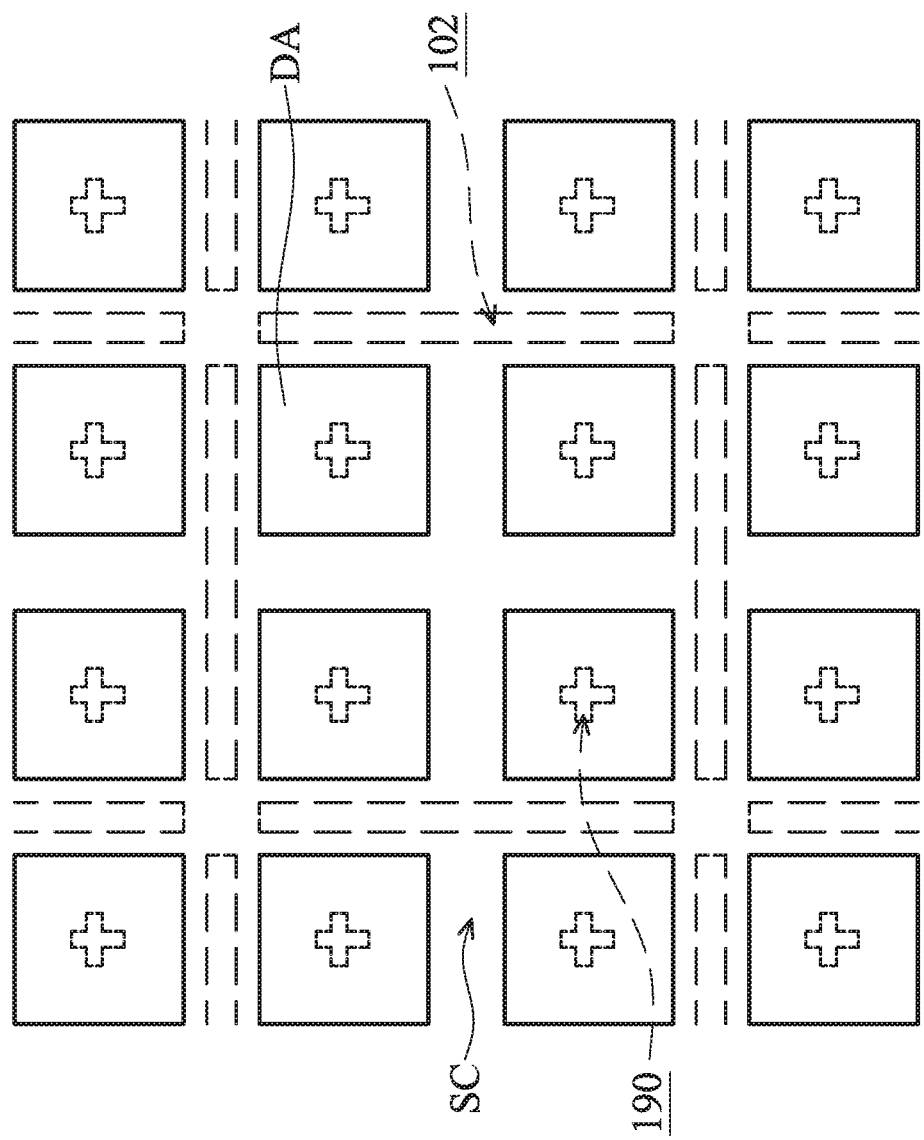
FIG. 13 is a top view of an intermediate stage of a process for forming a semiconductor device structure, in accordance with some embodiments.

Many variations and/or modifications can be made to embodiments of the disclosure. FIG. 13 is a top view of an intermediate stage of a process for forming a semiconductor device structure, in accordance with some embodiments. In some embodiments, both the recesses 102 and 190 are formed.

Figure 14:
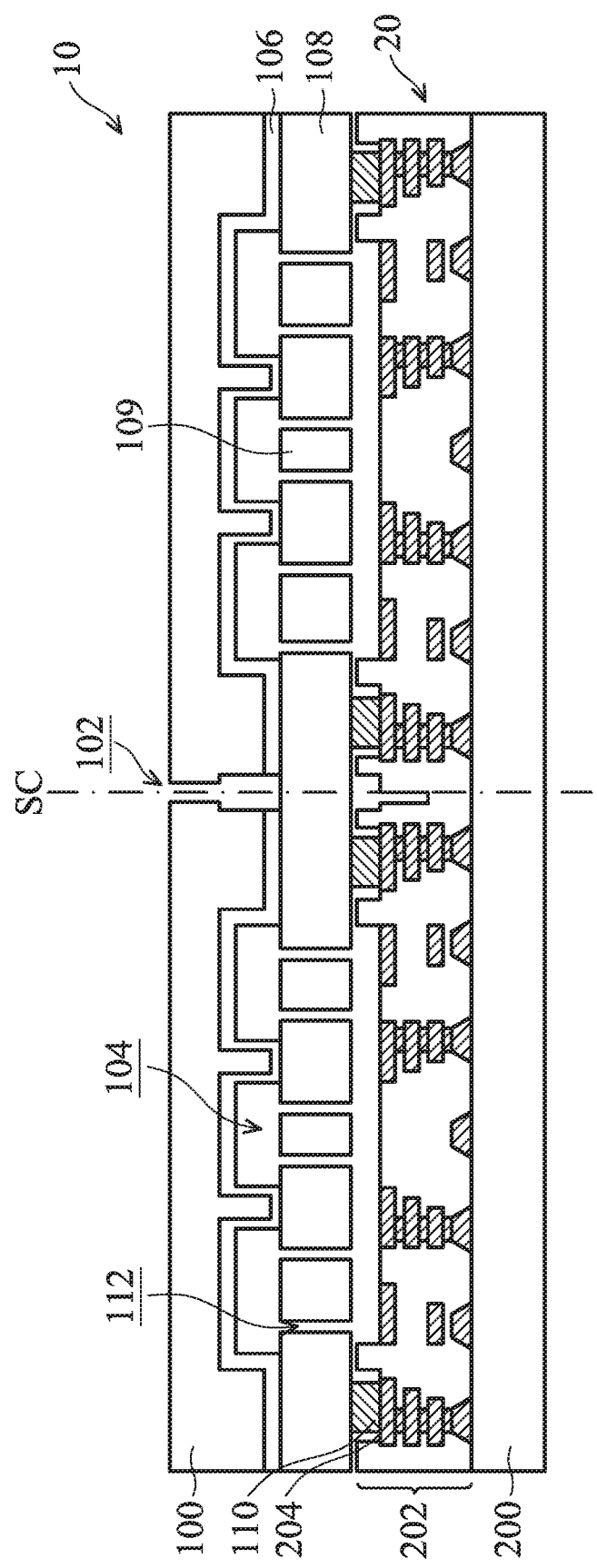
FIG. 14 is a cross-sectional view of an intermediate stage of a process for forming a semiconductor device structure, in accordance with some embodiments.

Many variations and/or modifications can be made to embodiments of the disclosure. FIG. 14 is a cross-sectional view of an intermediate stage of a process for forming a semiconductor device structure, in accordance with some embodiments. In some embodiments, the recess 102 penetrates through the base 100 of the wafer 10.

Figure 15:
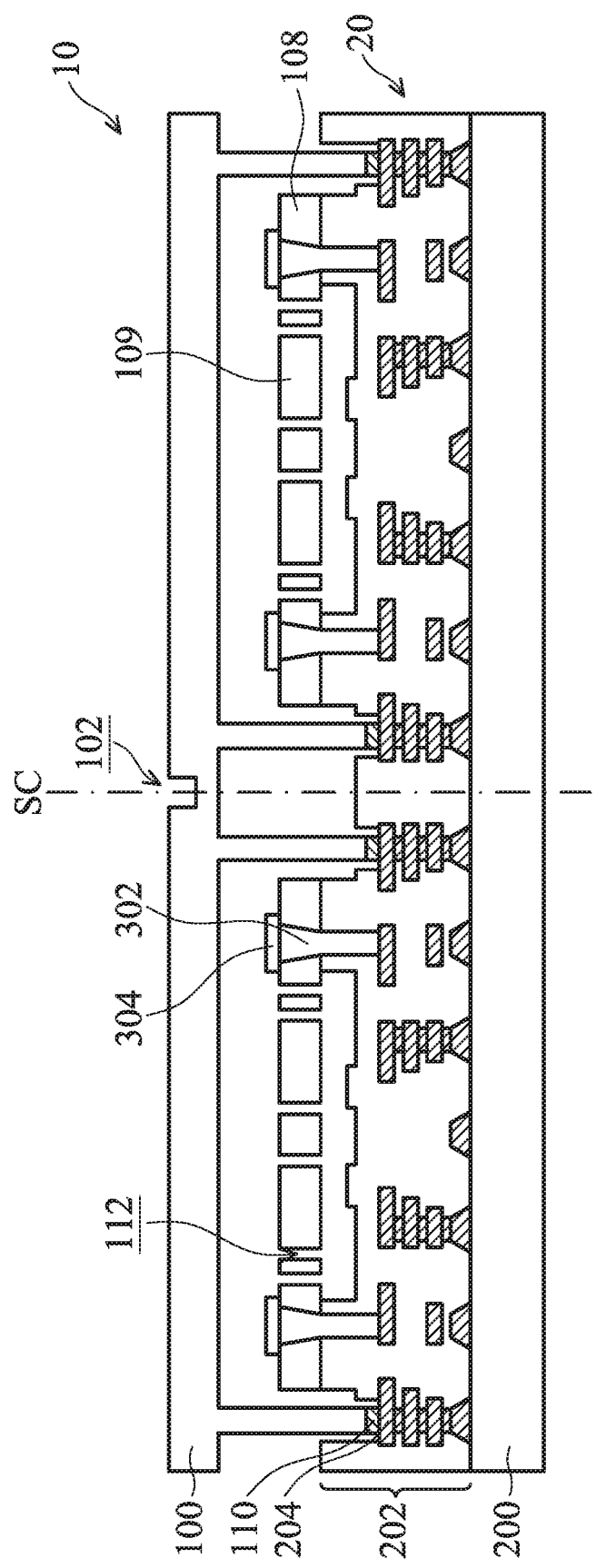
FIG. 15 is a cross-sectional view of an intermediate stage of a process for forming a semiconductor device structure, in accordance with some embodiments.

Many variations and/or modifications can be made to embodiments of the disclosure. FIG. 15 is a cross-sectional view of an intermediate stage of a process for forming a semiconductor device structure, in accordance with some embodiments. In some embodiments, the MEMS devices are formed on the wafer 20 before the wafers 10 and 20 are bonded together. In some embodiments, conductive features 302 and 304 are formed to form electrical connection between the MEMS devices and the semiconductor devices formed in the wafer 20. In some embodiments, the wafers 10 and 20 are bonded together through the bonding structures 204 of the wafer 20 and the bonding structures 110 of the wafer 10.

Figure 16:
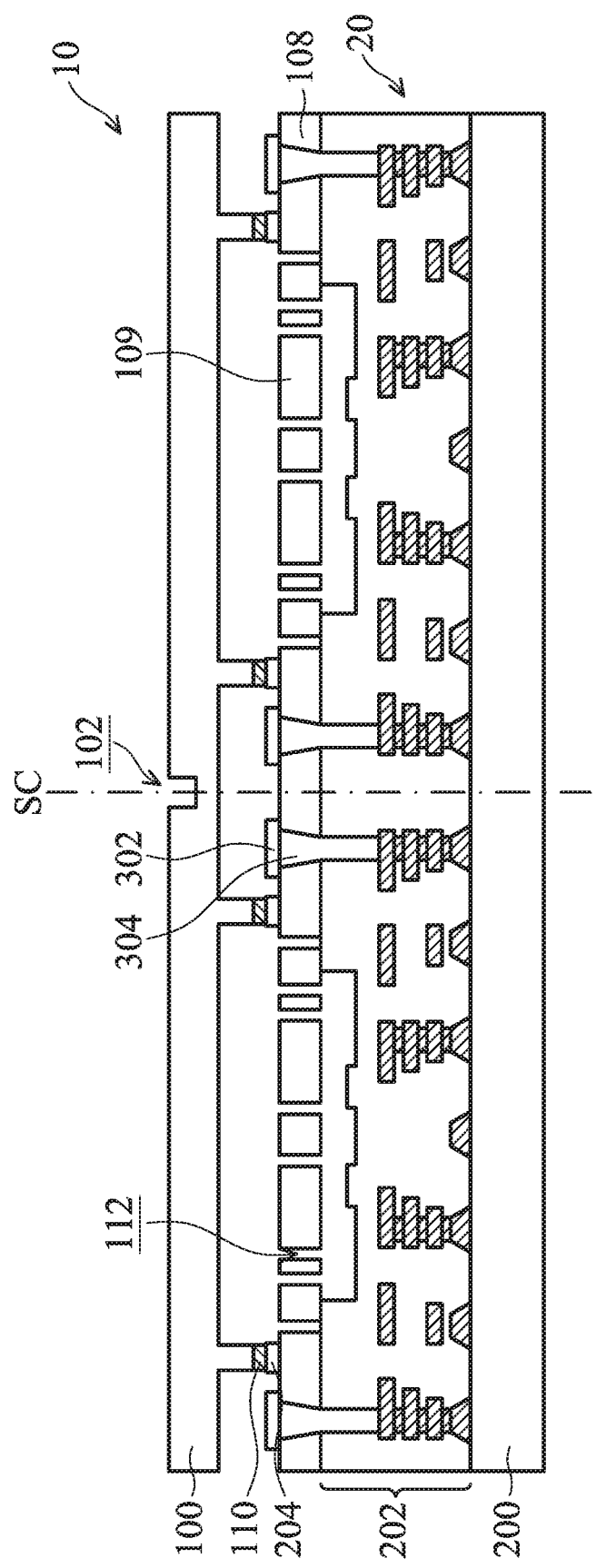
FIG. 16 is a cross-sectional view of an intermediate stage of a process for forming a semiconductor device structure, in accordance with some embodiments.

Many variations and/or modifications can be made to embodiments of the disclosure. FIG. 16 is a cross-sectional view of an intermediate stage of a process for forming a semiconductor device structure, in accordance with some embodiments. In some embodiments, the wafers 10 and 20 are bonded together through the bonding structures 204 of the wafer 20 and the bonding structures 110 formed on the semiconductor layer 108.

Embodiments of the disclosure involve bonding two wafers to form semiconductor device structures. One or more buffer recesses are formed on a first wafer before bonding with a second wafer. Due to the buffer recesses, the thermal expansions at different areas of the first wafer during the wafer bonding process are substantially the same. Therefore, the alignment between bonding structures of the to-be-bonded wafers becomes easier to achieve. The performance and reliability of the semiconductor device structure are significantly improved.

In accordance with some embodiments, a method for forming a semiconductor device structure is provided. The method includes receiving a first wafer having multiple predetermined die areas. The method also includes forming a recess in the first wafer, and the recess extends in a direction substantially parallel to an edge of one of the predetermined die areas. The method further includes receiving a second wafer. In addition, the method includes bonding and heating the first wafer and the second wafer after the recess is formed.

In accordance with some embodiments, a method for forming a semiconductor device structure is provided. The method includes receiving a first wafer having a plurality of predetermined die areas. The predetermined die areas are spaced apart from each other by a plurality of predetermined scribe lines. The method also includes forming a plurality of recesses in some of the predetermined scribe lines. The method further includes receiving a second wafer. The method includes bonding and heating the first wafer and the second wafer at an elevated temperature after the recesses are formed.

In accordance with some embodiments, a method for forming a semiconductor device structure is provided. The method includes receiving a first wafer and forming multiple recesses in the first wafer to surround an area of the first wafer. The method also includes receiving a second wafer. The method further includes bonding and heating the first wafer and the second wafer after the recesses are formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a first wafer comprising a first face and a second face opposite the first face and having a plurality of predetermined die areas;
    a plurality of recesses in the first face of the first wafer, wherein a first recess of the plurality of recesses extends in a direction substantially parallel to a first edge of at least one of the plurality of predetermined die areas and laterally surrounds the at least one of the plurality of predetermined die areas; and
    a second wafer bonded to the second face of the first wafer.

2. The semiconductor device structure of claim 1, further comprising:
    a second recess in the first wafer, wherein the second recess extends along a second edge of the at least one of the plurality of predetermined die areas.

3. The semiconductor device structure of claim 2, wherein the first recess and the second recess perpendicular intersect one another.

4. The semiconductor device structure of claim 1, wherein the first recess continuously surrounds only one of the plurality of predetermined die areas.

5. The semiconductor device structure of claim 1, wherein the first recess extends across a predetermined scribe line between two of the plurality of predetermined die areas.

6. The semiconductor device structure of claim 1, wherein the first recess continuously surrounds two or more of the plurality of predetermined die areas.

7. The semiconductor device structure of claim 1, further comprising:
    a second recess in the first wafer, wherein the second recess and the first recess are positioned in a same predetermined scribe line.

8. The semiconductor device structure of claim 1, wherein the first recess extends along predetermined scribe lines of the first wafer.

9. The semiconductor device structure of claim 1, further comprising a plurality of movable elements on the first wafer.

10. The semiconductor device structure of claim 1, wherein the first recess extends across one of the plurality of predetermined die areas.

11. A semiconductor device structure, comprising:
    a first wafer including a plurality of predetermined die areas, the first wafer having a first face and a second face opposite the first face, wherein the plurality of predetermined die areas are spaced apart from each other by a plurality of predetermined scribe lines;
    a second wafer bonded to the first face of the first wafer; and a plurality of recesses disposed on the second face of the first wafer, wherein some of the plurality of recesses correspond to predetermined scribe lines such that a first recess of the plurality of recesses continuously surrounds two or more of the plurality of predetermined die areas.

12. The semiconductor device structure of claim 11, wherein one of the recesses extends across one of the predetermined scribe lines.

13. The semiconductor device structure of claim 11, wherein the first wafer does not comprise any transistor, and the second wafer is a CMOS wafer.

14. The semiconductor device structure of claim 13, wherein the first wafer comprises a plurality of movable elements.

15. The semiconductor device structure of claim 11, wherein one of the plurality of recesses continuously surrounds two or more of the predetermined die areas.

16. The semiconductor device structure of claim 11, wherein the plurality of recesses comprises:
a first linear recess that extends in parallel with a first predetermined scribe line; and
a second linear recess that extends in parallel with a second predetermined scribe line such that the second linear recess perpendicularly intersects the first linear recess over one of the predetermined die areas.

17. A semiconductor device structure, comprising:
a first substrate corresponding to a first die, and comprising a first face and a second face opposite the first face;
a second substrate corresponding to a second die and bonded to the first face of the first substrate such that the second face of the first substrate faces the second substrate; and
one or more recesses in the second face of the first substrate.

18. The semiconductor device structure of claim 17, wherein the one or more recesses includes a first recess that extends continuously and linearly from a first outer edge of the first face to a second outer edge of the first face, the second outer edge being opposite the first outer edge.

19. The semiconductor device structure of claim 18, further comprising: a second recess that extends continuously and linearly from a third outer edge of the first face to a fourth outer edge of the first face, the third outer edge being opposite the fourth outer edge such that the second recess perpendicularly intersects the first recess.

20. The semiconductor device structure of claim 17, wherein the one or more recesses comprises:
a first linear recess that extends in parallel with a first set of edges of the first substrate; and
a second linear recess that extends in parallel with a second set of edges of the first substrate such that the second linear recess perpendicularly intersects the first linear recess over the first die or over the second die.

* * * * *